(12) United States Patent
McIntosh

(10) Patent No.: US 6,639,987 B2
(45) Date of Patent: Oct. 28, 2003

(54) COMMUNICATION DEVICE WITH ACTIVE EQUALIZATION AND METHOD THEREFOR

(75) Inventor: Jason Darrell McIntosh, Weston, FL (US)

(73) Assignee: Motorola, Inc., Schaumburg, IL (US)

( * ) Notice: Subject to any disclaimer, the term of this patent is extended or adjusted under 35 U.S.C. 154(b) by 35 days.

(21) Appl. No.: 10/014,767

(22) Filed: Dec. 11, 2001

(65) Prior Publication Data

US 2003/0108209 A1 Jun. 12, 2003

(51) Int. Cl.[7] ............................. H03B 29/00; H04M 7/00
(52) U.S. Cl. ........................ 381/71.6; 381/57; 455/570
(58) Field of Search ........................ 381/57, 71.6, 103; 455/550, 575, 569, 570, 90

(56) References Cited

U.S. PATENT DOCUMENTS

| | | | |
|---|---|---|---|
| 5,790,671 A | * | 8/1998 | Cooper ........................ 381/57 |
| 5,881,103 A | | 3/1999 | Wong et al. |
| 6,011,853 A | * | 1/2000 | Koski et al. .................... 381/56 |
| 6,052,464 A | | 4/2000 | Harris et al. |
| 6,141,540 A | * | 10/2000 | Richards et al. ............... 455/90 |
| 6,163,610 A | * | 12/2000 | Bartlett et al. ......... 379/433.01 |
| 6,233,462 B1 | * | 5/2001 | Kanai ........................... 455/550 |
| 6,252,968 B1 | | 6/2001 | Narasimhan et al. |
| 6,278,786 B1 | * | 8/2001 | McIntosh .................... 381/71.6 |

* cited by examiner

*Primary Examiner*—Forester W. Isen
*Assistant Examiner*—Brian T. Pendleton
(74) *Attorney, Agent, or Firm*—Randi L. Dulaney

(57) ABSTRACT

A communication device (10,110) includes an earpiece (14), a sensor (20), and an active equalization circuit (22). The earpiece (14) transmits an acoustic output signal (59) from the communication device (10,110). The sensor (10) is proximately located with the earpiece (14) and measures an acoustic pressure (61) at the earpiece (14) and generates a response signal (56). The active equalization circuit (22) is coupled to the sensor (20) and equalizes the acoustic output signal (59) using the response signal (56).

12 Claims, 12 Drawing Sheets

— PRIOR ART —

— PRIOR ART —

COMMUNICATION DEVICE WITH ACTIVE EQUALIZATION AND METHOD THEREFOR

BACKGROUND OF THE INVENTION

1. Field of the Invention

This invention relates in general to communication devices and in particular to communication devices having active equalization circuits for audio processing.

2. Description of the Related Art

Communication devices, such as portable cellular or cordless telephones and wired landline telephones, are well known in the art. Voice communication devices typically include a microphone, an earpiece, and a keypad. Recently, many communication devices also include a display. The microphone converts an acoustic input signal into an electric input signal. The earpiece converts an electric output signal into an acoustic output signal. Typically, a person positions the communication device against the person's head to align the microphone with the person's mouth and to align the earpiece with the person's ear to permit the person to speak the acoustic input signal into the microphone and to listen to the acoustic output signal generated by the earpiece. When a communication device permits a person to speak and listen to another party at the same time this is known as full duplex voice communications. The keypad permits a person to enter data, such as a phone number, into the communication device. The volume level of the acoustic output signal from the earpiece is set at a high enough level so that the person's ear can hear the level of the acoustic output signal generated by the earpiece, but not so high as to damage the person's hearing.

As advances in technology have permitted communication devices to be made smaller in size and lighter in weight, the available space for implementing necessary features such as microphones and earpieces becomes limited. One such trend in miniaturization is evident when viewing the following United States patents: U.S. Pat. No. Des. 424,557, issued May 9, 2000 to Nagle et al. and titled "Cellular Telephone Housing"; U.S. Pat. No. Des. 421,005, issued Feb. 22, 2000 to Lucaci et al. and titled "Telephone"; U.S. Pat. No. Des. 417,449 issued Dec. 7, 1999 to Harris et al. and titled "Portable Telephone"; all of which are assigned to the assignee of the present invention, and all of which are incorporated by reference herein. Each of these telephone designs has an earpiece, a display, a keypad and a microphone carried by one or more housings and arranged on the one housing or on two housings when the two housings are in their opened position during use. The earpiece and the microphone are located at opposite ends of the one or more housings during use to maximize the distance between the earpiece and the microphone and to align the earpiece and the microphone with a person's ear and mouth, respectively, while minimizing the total length of the one or more housings. However, the advantage of having easily accessible features, such as a large keypad or large display, contrasts with the availability of limited space on the one or more housings of the telephone set to place such features.

One drawback to traditional communication devices is that the experienced volume level and frequency spectrum of the acoustic output signal varies as the acoustical impedance loading of the communication device to a person's ear varies. The acoustical impedance loading is related to the volume of space, as well as any leakage paths, between the communication device and the listener's ear. As the coupling of the communication device to the ear changes, the impedance loading changes. For example, FIG. 1 illustrates the frequency response of a conventional portable telephone prior to auditory enhancements. The graph in FIG. 1 illustrates the frequency response of three simulated acoustical loadings of the listener's ear: a sealed ear simulator, a low leak simulator, and a high leak simulator. As illustrated, the frequency response varies greatly between the three loading situations, causing the listener to experience an undesirable acoustic response variability. This undesirable acoustic response variability can lead to such things as acoustic discomfort and unintelligibility of the communication during any given voice conversation as the communication device is moved from tightly sealed to the ear, to slightly removed from the ear (low leak), to further removed from the ear (high leak—i.e. ¼ inch to ⅛ inch off the ear).

Recently communication device designers have implemented mechanical equalization to improve the auditory experience of the listener and minimize the effects of changes in acoustical loading between the earpiece of the communication device to the listener's ear. FIG. 2 illustrates the frequency response of a conventional portable telephone with the earpiece and associated mechanics optimized for a consistent acoustical response. The graph in FIG. 2 illustrates the frequency response of the same three simulated acoustical loadings of the listener's ear illustrated and described in FIG. 1. As illustrated in FIG. 2, the lower frequencies are attenuated significantly under high leak acoustical loading situations versus sealed ear acoustical loading situations to as much as 25 dB at certain frequencies. Contrasted to the attenuation at low frequencies, the higher frequency responses merge toward a substantially similar level for the three simulated loadings. Although maintaining intelligibility across the frequency spectrum for all three loading situations, the result continues to be acoustically inconsistent voice communication for the listener as the acoustical loading of the listener's ear varies.

Therefore, what is needed is a low cost, minimal sized means for providing a constant frequency response and volume level to a person using a communication device independent of the unique characteristics of the user's ear and how well the communication device is acoustically coupled to the user's ear.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE PREFERRED EMBODIMENT(S)

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Figure 1:
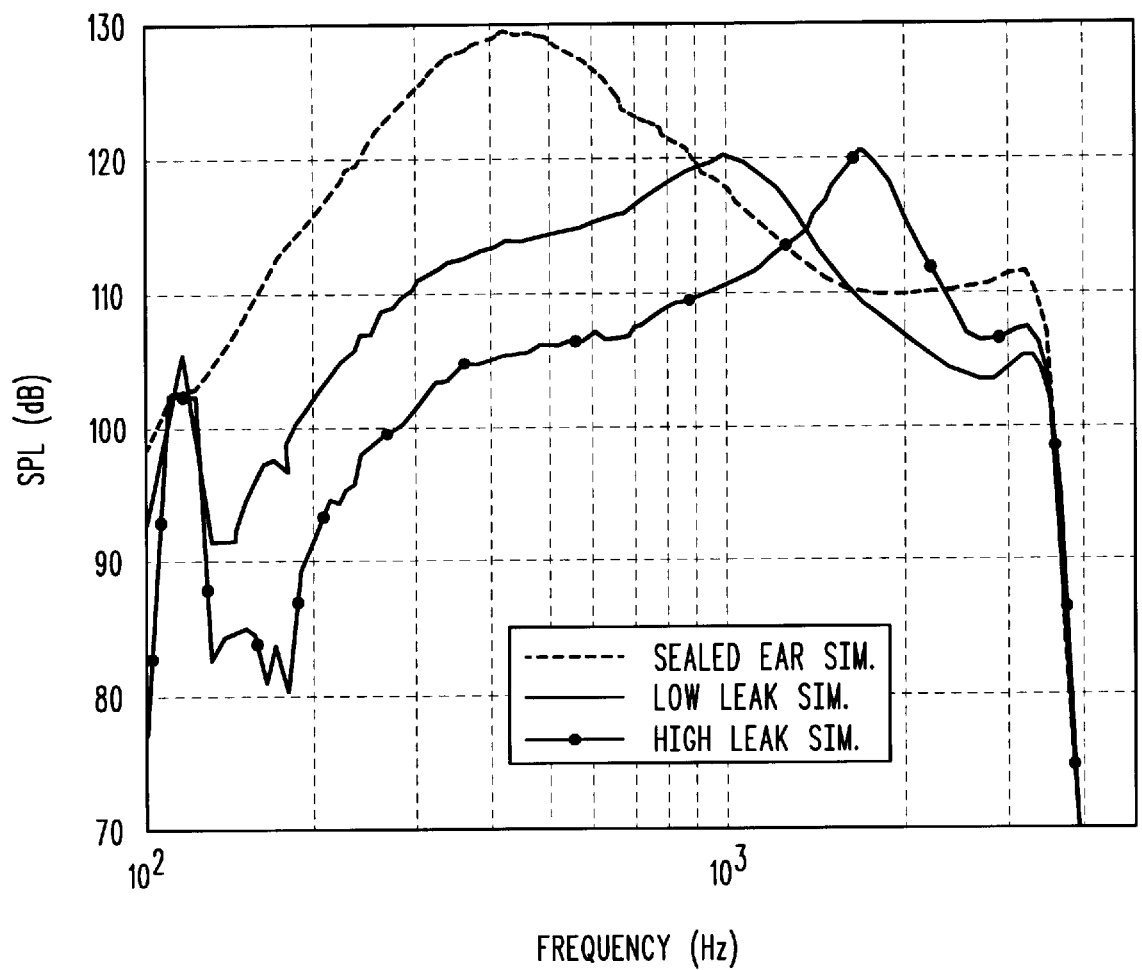
FIGS. 1 and 2 illustrate the frequency response of a conventional portable telephone.
Figure 2:
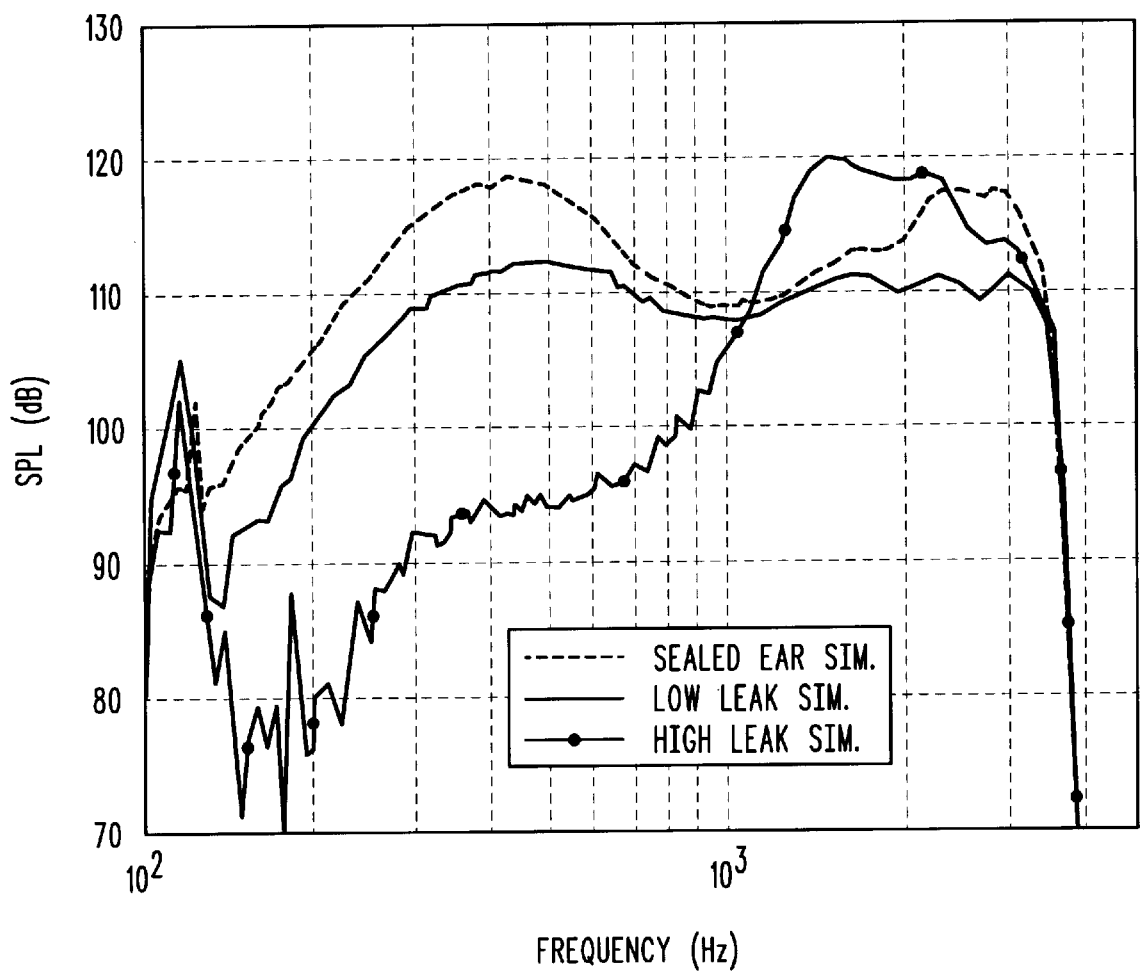
Figure 3:
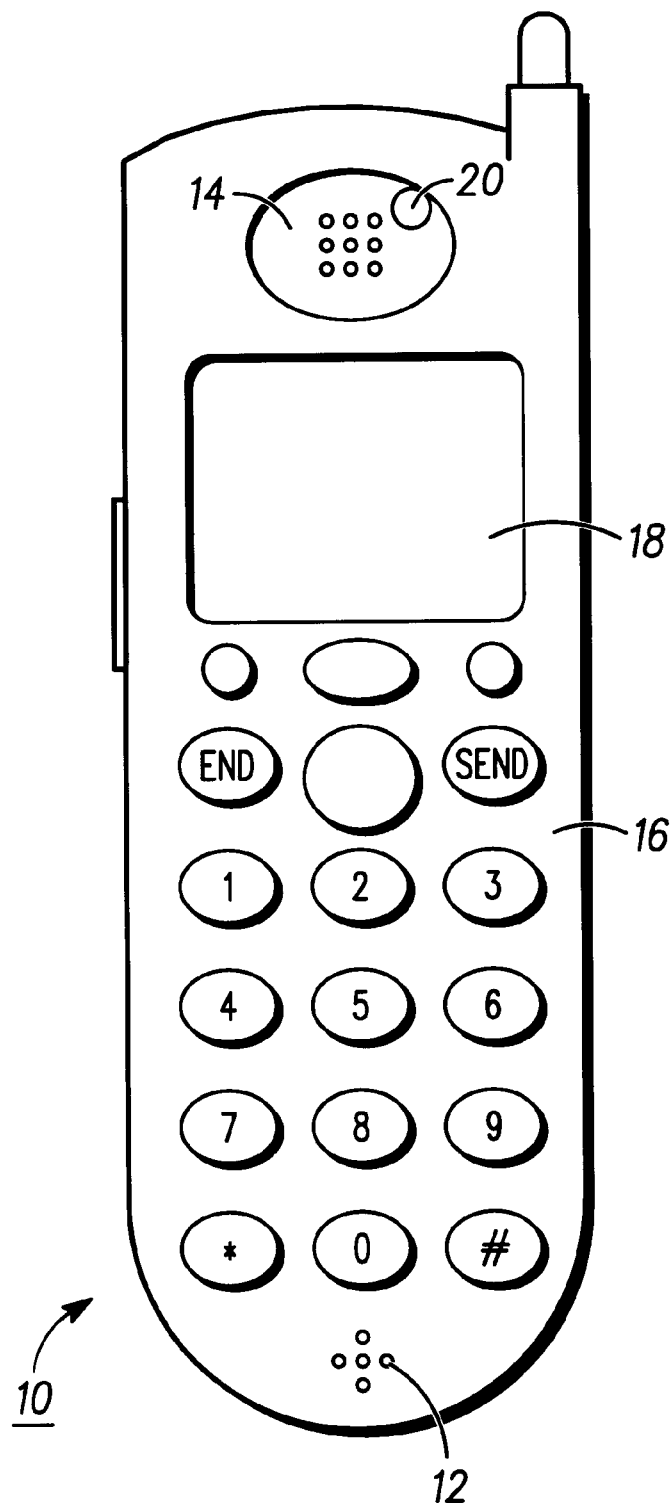
FIG. 3 illustrates a communication device in accordance with the preferred embodiment of the present invention.

FIG. 3 illustrates a communication device 10, in accordance with the present invention. The communication device 10 preferably is a voice communication device. The communication device 10, for example, can be a cellular telephone (as illustrated), a cordless telephone, a wired landline telephone, or a personal communicator such as the V200 Personal Communicator manufactured by Motorola Inc. of Schaumburg, Ill. In the following description, the term "communication device" refers to any of the communication devices mentioned above or an equivalent. The communication device 10 preferably includes a microphone 12, an earpiece 14, a keypad 16, a display 18, and a sensor 20. The sensor 20, in accordance with a preferred embodiment of the present invention, is proximately located with the earpiece 14, as illustrated. The microphone 12 converts an acoustic input signal received from a voice transmission to the communication device 10 into an electric input signal. The earpiece 14 converts an electric output signal into an acoustic output signal transmitted from the communication device 10 to be heard by the listener of the communication device 10. The keypad 16 allows the user of the communication device 10 to enter data such as phone numbers and text memos. The display 18 displays data such as one or more communication messages, phone numbers, or caller identifications. The sensor 20 measures the audio response related to the acoustic pressure at the earpiece 14. An active equalization circuit (not shown—see FIG. 4) is preferably coupled to the sensor 20 for equalizing the audio response at the earpiece 14.

Figure 4:
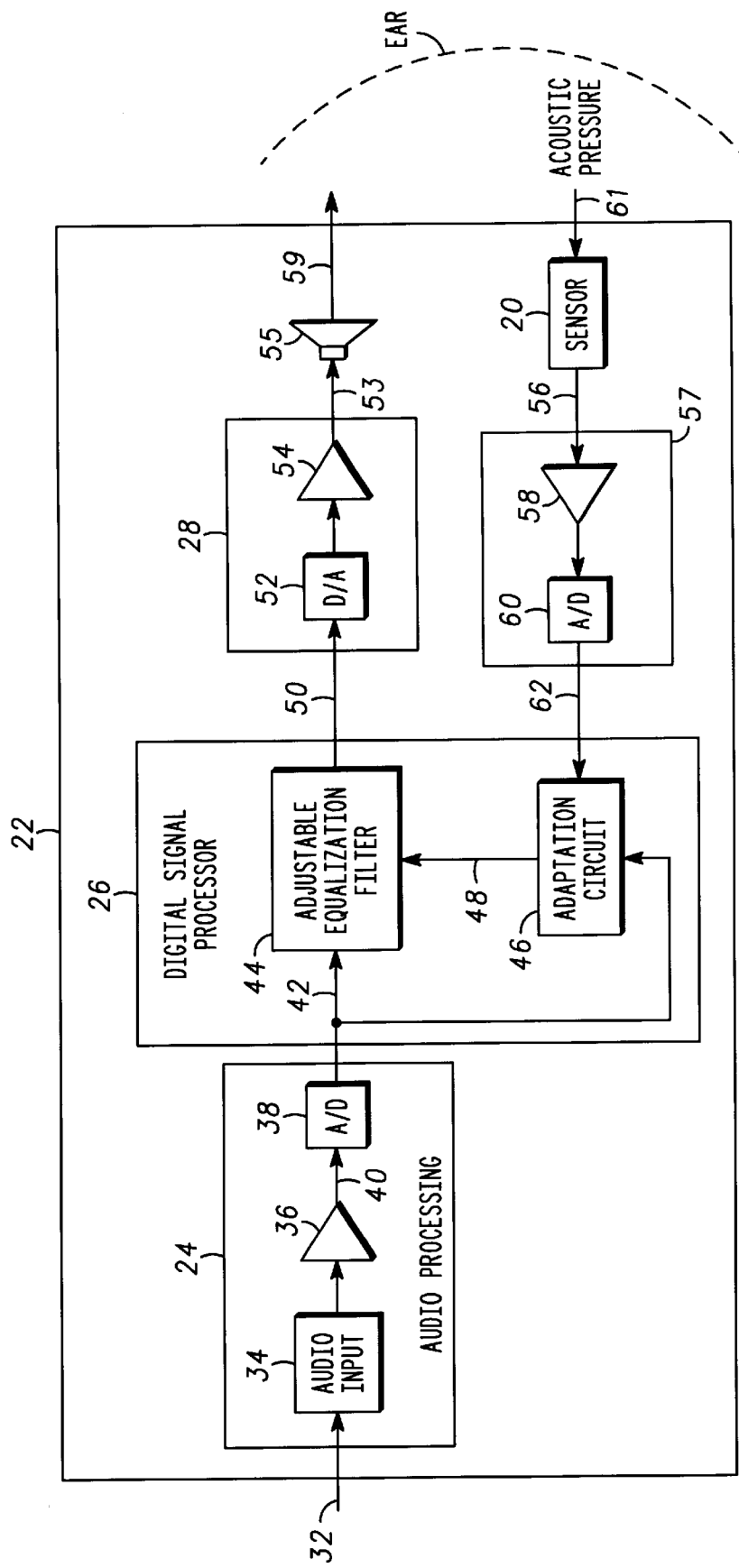
FIG. 4 is an electronic block diagram of one embodiment of an active equalization circuit for use within the communication device of FIG. 3, in accordance with the preferred embodiment of the present invention.

FIG. 4 is an electronic block diagram of one embodiment of an active equalization circuit 22 for use within the communication device 10 of FIG. 3, in accordance with the preferred embodiment of the present invention. The active equalization circuit 22, as illustrated in FIG. 3, includes an audio processing block 24, a digital signal processor 26, an output audio processing block 28, and the sensor 20. It will be appreciated by one of ordinary skill in the art that the sensor 20 can be an element of the active equalization circuit 22 or alternatively can be a separate element within the communication device 10 coupled to the active equalization circuit 22. It will be appreciated by one of ordinary skill in the art that the active equalization circuit 22 can include additionally other circuit blocks to enhance the operation of the active equalization circuit 22 as described herein. Similarly, it will be appreciated by one of ordinary skill in the art that the active equalization circuit 22 can be implemented as illustrated in FIG. 4 or an equivalent.

The audio processing block 24 of the active equalization circuit 22 receives a plurality of audio signals 32 and processes the received plurality of audio signals 32 for use within the communication device 10 of FIG. 3. It will be appreciated by one of ordinary skill in the art that the plurality of audio signals 32 can include an analog audio signal, a digital audio signal, or any combination thereof. The audio processing block 24 preferably includes an audio input 34 coupled to an amplifier 36, which is coupled to an analog to digital (A/D) converter 38. It will be appreciated by one of ordinary skill in the art that the A/D converter 38 is not functionally necessary and can be eliminated when the plurality of audio signals 32 is one or more digital audio signals. It will further be appreciated by one of ordinary skill in the art that the audio processing block 24 can include the elements described and illustrated herein or an equivalent to perform the requirements of the audio processing block 24. After being received by the audio input 34, the plurality of audio signals 32 is amplified by the amplifier 36, thereby generating a plurality of amplified audio signals 40, and converted to a digital input signal 42 (if necessary) via the analog to digital converter 38. For each of the plurality of amplified audio signals 40, the resultant digital input signal 42 preferably comprises a continuous stream of digital samples. The digital input signal 42 is inputted into the digital signal processor 26 for processing.

The digital signal processor (DSP) 26, coupled to the audio processing block 24, is utilized to perform mathematical applications within the communication device 10. For example, the software programmed into the digital signal processor 26 supports a plurality of DSP algorithm implementations for use by the communication device 10. The digital signal processor 26 filters or otherwise performs an arithmetic evaluation or transformation received inputs. The digital signal processor 26 for example can be the DSP 56300 family of 24-bit digital signal processors, which are commercially available from Motorola, Inc. of Schaumburg, Ill. It will be appreciated by one of ordinary skill in the art that other similar digital signal processors can be utilized for the digital signal processor 26, and that additional digital signal processors of the same or alternative type can be utilized as required to handle the processing requirements of the digital signal processor 26. As an element of the active equalization circuit 22, the digital signal processor 26 receives the digital input signal 42 and filters the digital input signal 42 via an adjustable equalization filter 44. The adjustable equalization filter 44 operates using an adjustable filter response and gain. An adaptation circuit 46, coupled to the adjustable equalization filter 44, provides information for adjustment of the filter response and gain via an adjustment signal 48. The adaptation circuit 46, in accordance with a preferred embodiment of the present invention, includes the intelligence for adjusting the adjustable equalization filter 44 by generating the adjustment signal 48. Once filtered via the adjustable equalization filter 44, the filtered audio signal 50 is processed by the output audio processing block 28; and a processed output audio signal 53 is sent to a speaker 55.

In one embodiment of the present invention, the adaptation circuit 46 includes noise compensation intelligence. For example, the adaptation circuit 46 preferably compensates for external audio noise sources at the input to the sensor 20, such as rubbing against the head, or using coherence measurement techniques. It will be appreciated by one of ordinary skill in the art that the noise compensation intelligence can be as described herein or an equivalent.

The output audio processing block 28, coupled to the digital signal processor 26, preferably includes a digital to analog (D/A) converter 52 coupled to an output amplifier 54. It will be appreciated by one of ordinary skill in the art that the output audio processing block 28 can include the elements described and illustrated herein or an equivalent to perform the requirements of the output audio processing block 28. The filtered signal 50 is converted to an analog signal via the digital to analog converter (D/A) 52 and then amplified via the output amplifier 54. The speaker 55 then receives the processed output audio signal 53. The speaker 55, coupled to the output audio processing block 28, is adapted to convert the processed output audio signal 53 into an acoustic output signal 59 for radiation into the ear of the listener of the communication device 10. The speaker 55 preferably is proximately located with the earpiece 14 of the communication device 10. Alternatively, the speaker 55 can be positioned away from the earpiece 14. The active equalization circuit 22 thus provides a means for received audio signals to be processed using an adjustable equalization process prior to being played and consequently heard by the ear of the user of the communication device 10.

In a preferred embodiment of the present invention, the active equalization circuit 22 includes the sensor 20. The sensor 20, for example, can be a microphone proximately located at the earpiece 14 of the communication device 10 or alternatively can be a microphone connected via a transmission line to the earpiece 14. It will be appreciated by one of ordinary skill in the art that, in accordance with the present invention, the sensor 20 can be located within the communication device 10 as mentioned herein or an equivalent. The sensor 20 monitors the frequency response of the earpiece 14 by measuring an acoustic pressure 61. One of ordinary skill in the art will recognize that the acoustic pressure 61 varies as the communication device 10 is brought closer or farther away from the ear of the user of the communication device 10. The sensor 20 is coupled to and feeds a response signal 56 to a response signal processing block 57. The response signal processing block 57 preferably includes a response amplifier 58 coupled to a response analog to digital (A/D) converter 60. It will be appreciated by one of ordinary skill in the art that the response signal processing block 57 can include the elements described and illustrated herein or an equivalent to perform the requirements of the response signal processing block 57. The response signal 56 is amplified by the response amplifier 58 and converted to a digital signal by the response A/D converter 60, resulting in a response data signal 62. The digital signal processor 26, coupled to the response signal processing block 57, receives and processes the response data signal 62. The adaptation circuit 46 of the digital signal processor 26 uses the response data signal 62 along with the digital input signal 42 to determine how the adjustment signal 48 is to be updated to achieve the desired frequency responses of the adjustable equalization filter 44. This process thereby "equalizes" the earpiece 14. (i.e.: provides constant sensitivity response with respect to volume control) The new frequency response of the adjustable equalization filter 44 is then used to filter the digital input signal 42. The process results in a frequency response, which is typically flat across the frequency range of interest (i.e.: 300–3400 Hz) and is maintained at a constant sound pressure level at the sensor 20. However, the desired frequency response can be any desirable spectral shape chosen based on user preference or improving intelligibility based on background noise estimates. This process continues with the adjustable equalization filter 44 being regularly updated to take into account any changes in how the user is holding the communication device 10 to their ear.

Figure 5:
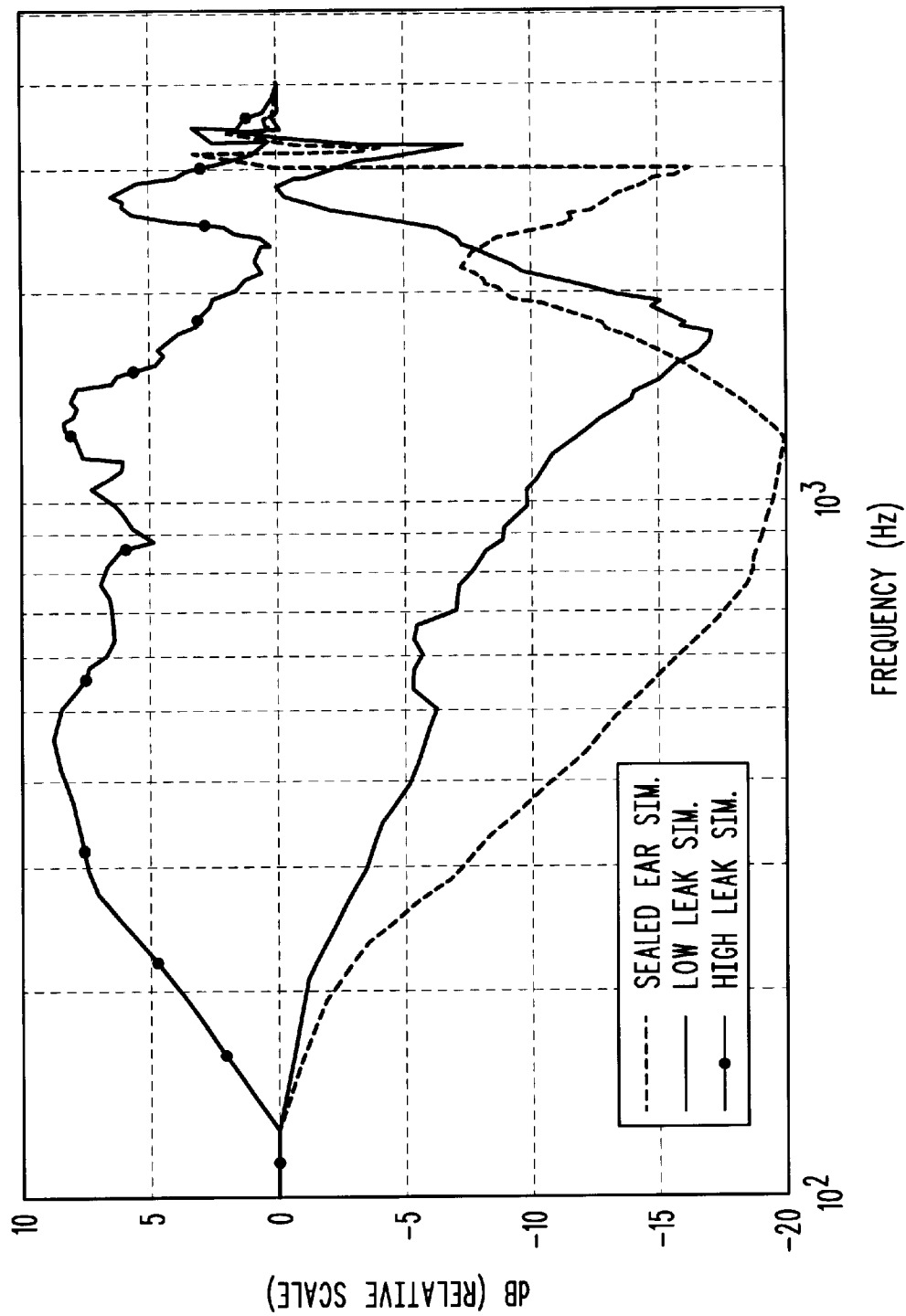
FIG. 5 illustrates the frequency response of an adjustable equalization filter for use in the active equalization circuit of FIG. 4, in accordance with the preferred embodiment of the present invention.

FIG. 5 illustrates the filter response of the adjustable equalization filter 44 of FIG. 4, in accordance with the preferred embodiment of the present invention. As illustrated in FIG. 5, the frequency response and the gain of the adjustable equalization filter 44 varies for various acoustical loading conditions, (i.e.: a sealed ear, a low leak, and a high leak) providing a full spectrum adaptation. For example, at $10^3$ Hz, there is a 35 dB difference between the filter gain when the earpiece is firmly pressed to the ear (i.e.: sealed ear) and when the earpiece is ½ inch away from the ear (i.e.: high leak). Similarly, at $10^3$ Hz, there is a 10 dB difference between the filter gain when the earpiece is firmly pressed to the ear (i.e.: sealed ear) and when the earpiece is lightly pressed to the ear (i.e.: low leak).

Figure 6:
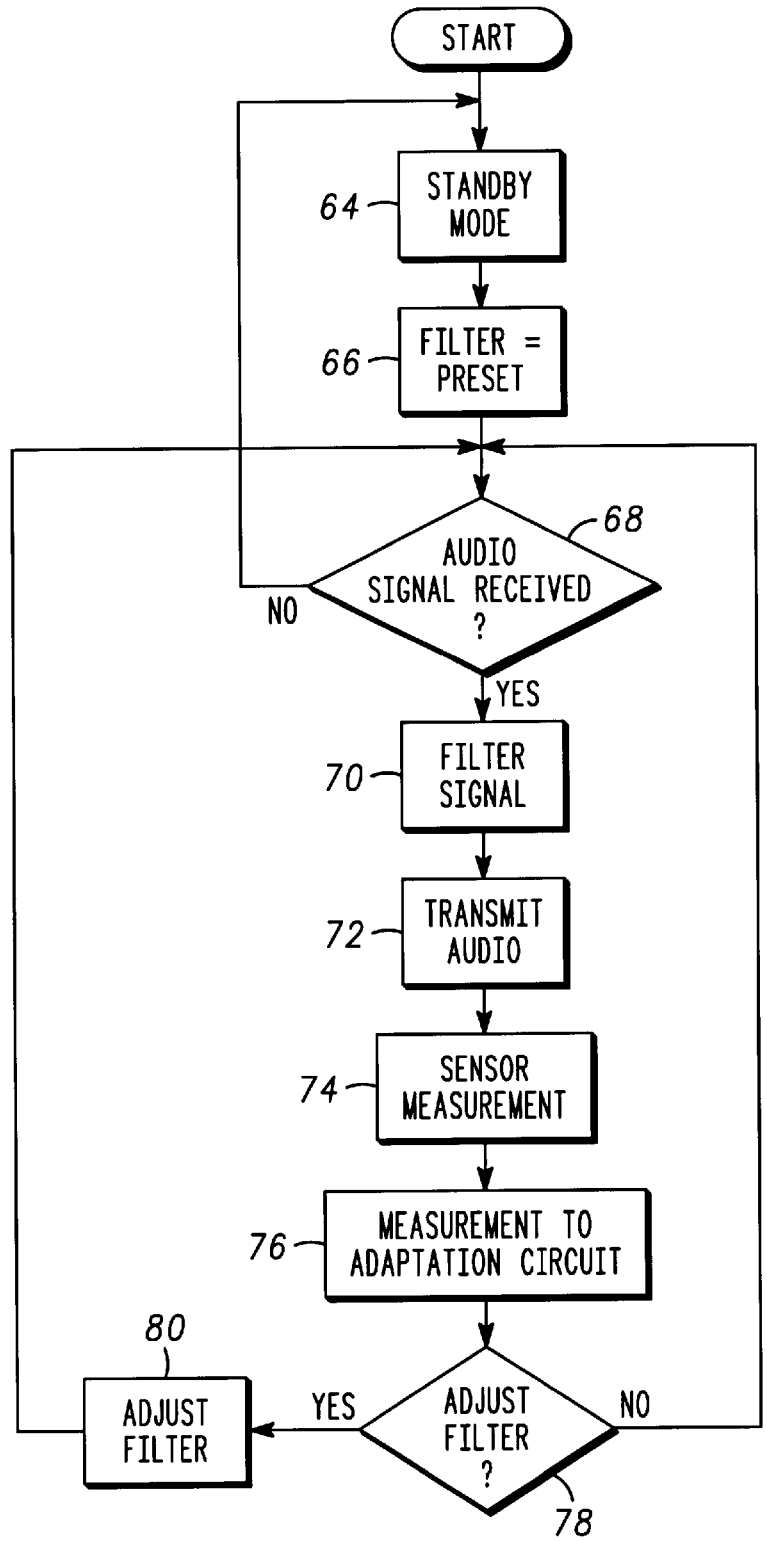
FIG. 6 is a flowchart illustrating the operation of the active equalization circuit of FIG. 4, in accordance with the preferred embodiment of the present invention.

FIG. 6 is a flowchart illustrating the operation of the active equalization circuit 22 of FIG. 4, in accordance with the preferred embodiment of the present invention. The process begins in Step 64 in which the active equalization circuit 22 is in standby mode. Next, in Step 66, the filter response of the adjustable equalization filter 44 is set to a preset filter response. The preset filter response may be hard coded or programmed into the digital signal processor 26 during manufacturing, may be programmed over-the-air into the digital signal processor 26 or may be a manually set value. It will be appreciated by one of ordinary skill in the art that other programming methods can be utilized for programming the preset filter response. Next, in Step 68, it is determined whether or not an audio signal has been received. For example, it is determined whether the audio processing block 24 receives the plurality of audio signals 32. (see FIG. 4) When no audio signal has been received in Step 68, the process preferably returns to Step 64 and the active equalization circuit 22 returns to standby mode. It will be appreciated by one of ordinary skill in the art that, alternatively, the active equalization circuit 22 can continuously process and equalize whether or not a new audio signal has been received. When receipt of an audio signal is detected in Step 68, the process continues to Step 70 wherein the received audio signal is filtered using the current filter response of the filter. The filter response can be the preset filter response value or the most recent value set for the filter. For example, the plurality of audio signals 32 is processed through the audio processing block 24, and then the resultant digital input signal 42 is fed to the adjustable equalization filter 44 of the digital signal processor 26. Next, in Step 72, the audio is transmitted. For example, the filtered audio signal 50 is processed by the output audio processing block 28, and sent to the speaker 55 for transmission to be heard by the ear of the user of the communication device 10. Next, in Step 74, in accordance with the preferred embodiment of the present invention, the sensor 20 takes a measurement of the acoustic pressure 61. Next, in Step 76, this measurement is fed to the adaptation circuit 46. For example, the response signal 56 from the sensor 20 is processed by the response signal processing block 57, and the resultant response data signal 62 is fed to the adaptation circuit 46. Next, in Step 78, it is determined whether an adjustment to the adjustable equalization filter 44 is required. For example, the adaptation circuit 46 compares the response data signal 62 to the digital input signal 42 to determine whether or not to send the adjustment signal 48 to the adjustable equalization filter 44. When no adjustment is required in Step 78, the process cycles back to Step 68 and checks for receipt of an audio signal. In Step 80, when an adjustment is required in Step 78, the filter is adjusted. For example, the equalization filter 44 adjusts its filter response upon receipt of the adjustment signal 48 and using the information contained within the adjustment signal 48. The process then cycles back to Step 68 and checks for receipt of an audio signal.

The process as illustrated and described in FIG. 6 provides a method in the communication device 10 for receiving a first audio signal; filtering the first audio signal using a filter response, thereby generating a first filtered audio signal; transmitting the first filtered audio signal through the earpiece 14; measuring the acoustic pressure 61 at the earpiece 14; adjusting the filter response using the measured acoustic pressure 61, thereby generating an adjusted filter response value; receiving a second audio signal; filtering the second audio signal using the adjusted filter response; and transmitting the second filtered audio signal through the earpiece 14. The process can continue, as illustrated, for multiple received audio signals indefinitely.

The operation of the active equalization circuit 22 as described in FIG. 6 results in the user hearing a desired response such as a constantly flat frequency response at a fixed volume level, independent of how well the earpiece is coupled to the user's ear. The user can press the earpiece firmly to their ear, and then pull it away and still hear the audio at substantially the same volume level and with the same spectral content (bass and treble) as when the earpiece was pressed firmly to the ear. This result is beneficial to the user. First, a flat frequency response is more pleasing to listen to. Non-flat responses are typically "tinny" and can quickly grow annoying. Second, the user no longer has to firmly press the communication device to their ear, but can lightly rest it against their ear, or hold it so that it's not even touching it. When a communication device is pressed firmly to a user's ear, the pressure causes significant discomfort to the user after a few minutes, and causes the user to frequently switch the communication device from one ear to the other. With the present invention, the user no longer has to apply significant pressure to the ear to obtain good audio quality, and thus it greatly increases the comfort when using the communication device.

Figure 7:
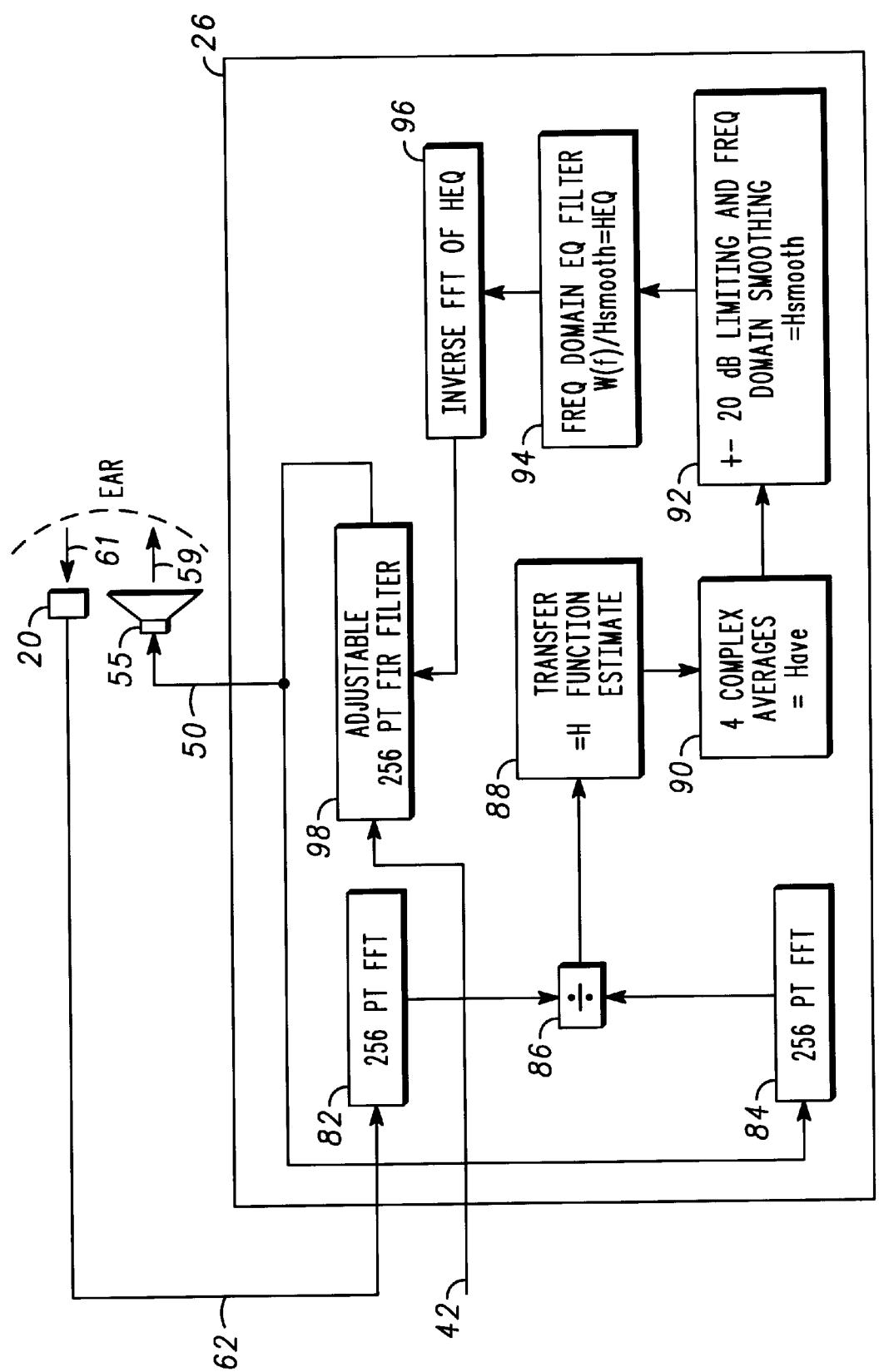
FIG. 7 illustrates a programming algorithm of the digital signal processor for use within the active equalization circuit of FIG. 4, in accordance with the preferred embodiment of the present invention.

FIG. 7 illustrates a programming algorithm of the digital signal processor 26 for use within the active equalization circuit 22 of FIG. 4, in accordance with the preferred embodiment of the present invention. It will be appreciated by one of ordinary skill in the art that the programming algorithm in accordance with the present invention can be as described herein or an equivalent.

The programming algorithm illustrated in FIG. 7 that creates the adjustable equalization filter 44 uses a Fast Fourier Transform (FFT) approach. It takes several FFTs and uses an average of them to estimate the earpiece's frequency response. As illustrated, a 256 point FFT 82 of the response data signal 62 and a 256 point FFT 84 of the filtered audio signal 50 are fed to a divider block 86. The output of the divider block 86 is fed into a transfer function-estimating block 88. The output of the transfer function-estimating block 88 is fed into an averaging block 90 in which an average is determined. This frequency response is then smoothed in the frequency domain using a moving average window as in block 92. This smoothed frequency response is inverted in block 94. At this point an optional frequency shaping can be applied which will typically attenuate the low frequencies and boost the high frequencies, however any desired frequency response can be used. In block 96, the inverted transfer function is inversed FFT'd to produce a real valued impulse response, which are the taps for a Finite Impulse Response (FIR) digital filter of block 98 that will equalize the earpiece. To maintain a smooth transition from the old filter and the updated filter, a weighted average of the previous taps and this new filter is used to create the new digital equalization filter. Example parameters are: the FFT size is 256 points, the sample rate is 8 KHz, and the number of FFT's averaged are 4, the filter tap weighting is 0.5 for the old taps and 0.5 for the new taps.

Figure 8:
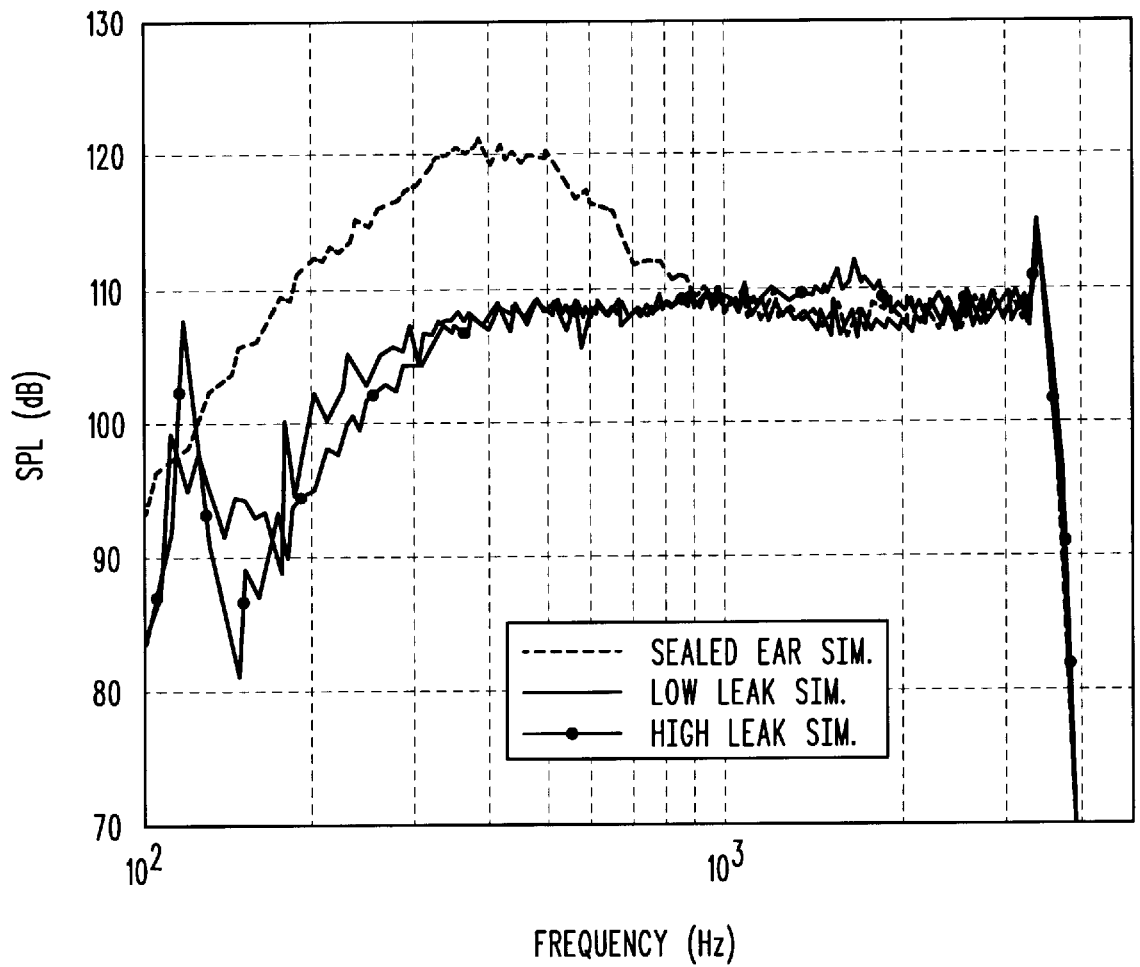
FIG. 8 illustrates the frequency response of a portable telephone using the active equalization circuit of FIG. 4, in accordance with the preferred embodiment of the present invention.

FIG. 8 illustrates the frequency response of a portable telephone using the active equalization circuit 22 of FIG. 4, in accordance with the preferred embodiment of the present invention. As illustrated, the active equalization circuit 22 and operation herein described in accordance with the present invention allows a smooth frequency and volume response over a wide bandwidth of frequencies whether under a sealed ear, a low leak, or a high leak condition. By using circuitry such as the digital signal processor 26 already contained within the communication device 10, the present invention provides a low cost, minimal sized means for providing a constant frequency response and volume level to a person using a communication device independent of the unique characteristics of the user's ear and how well the communication device is acoustically coupled to the user's ear.

Figure 9:
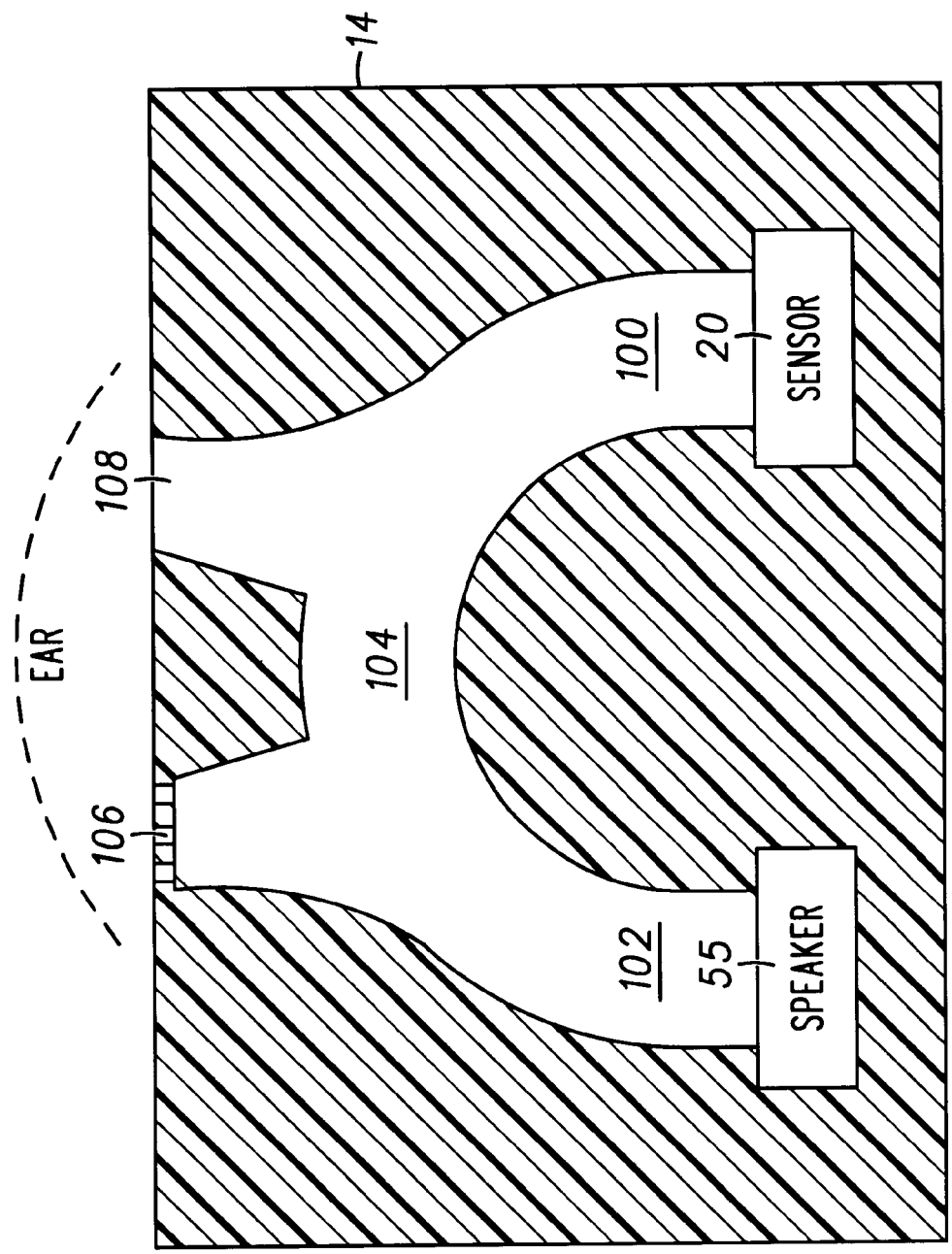
FIG. 9 illustrates a cross section view of a portion of the communication device of FIG. 3, in accordance with the preferred embodiment of the present invention.

FIG. 9 illustrates one implementation of a portion of the communication device 10 with the active equalization circuit 22 in accordance with the present invention. FIG. 9, for example, can be a cross section view of the earpiece 14 of the communication device 10 of FIG. 3. As illustrated the sensor 20 can monitor the frequency response of the earpiece 14 by measuring the acoustic pressure through a sensor communication path 100. The sensor communication path 100 allows the sensor 20 to be located anywhere within the communication device 10, providing design flexibility for the communication device designers. For example, the display 18 of the communication device 10 can be designed independently of the size or location of the sensor 20. The sensor communication path 100 provides an acoustic communication path for audio responses from a sensor port 108 at the surface of the earpiece 14 to be communicated to the sensor 20. It will be appreciated by one of ordinary skill in the art that the distance of the sensor communication path 100 can be negligible or can be any required distance within the communication device 10. In accordance with the present invention, the adaptation circuit 46 (see FIG. 4) preferably includes a pre-programmed transfer function of the sensor communication path 100 for recovering the acoustic response received at the sensor port 108. It will be appreciated by one of ordinary skill in the art that the transfer function of the sensor communication path 100 can alternatively be calculated or otherwise determined by the adaptation circuit 46.

Similarly, as illustrated, the speaker 55 can communicate the acoustic output signal 59 through a speaker communication path 102 to a speaker port 106 for radiation into the ear of the listener. The speaker communication path 102 allows the speaker 55 to be located anywhere within the communication device 10, providing design flexibility for the communication device designers. It will be appreciated by one of ordinary skill in the art that the distance of the speaker communication path 102 can be negligible or can be any required distance within the communication device 10. In accordance with the present invention, the adaptation circuit 46 preferably includes an algorithm for automatically compensating for the transfer function of the speaker communication path 102 for ensuring accuracy of the calculations of the adaptation circuit 46.

Preferably, in accordance with the present invention, a bypass path 104 is coupled between the sensor communication path 100 and the speaker communication path 102. The bypass path 104 provides an alternative acoustic communication path for audio responses at the surface of the earpiece 14 to be communicated to the sensor 20 in the case that the sensor port 108 is blocked or not designed into the earpiece 14. This provides an extra level of safety by giving the sensor 20 an alternative path for measurement of audio responses. For example, when the sensor port 108 is blocked, the digital signal processor 26 (see FIG. 4) will continue to increase the audio signal, thereby, resulting in a potential acoustic safety hazard. The bypass path 104 minimizes this type of safety hazard. Similarly, the bypass path 104 provides an alternative acoustic communication path for radiation of an acoustic output into the ear of the listener in the case that the speaker communication path 102 is blocked. This provides an additional assurance that the listener will hear the acoustic output.

Figure 10:
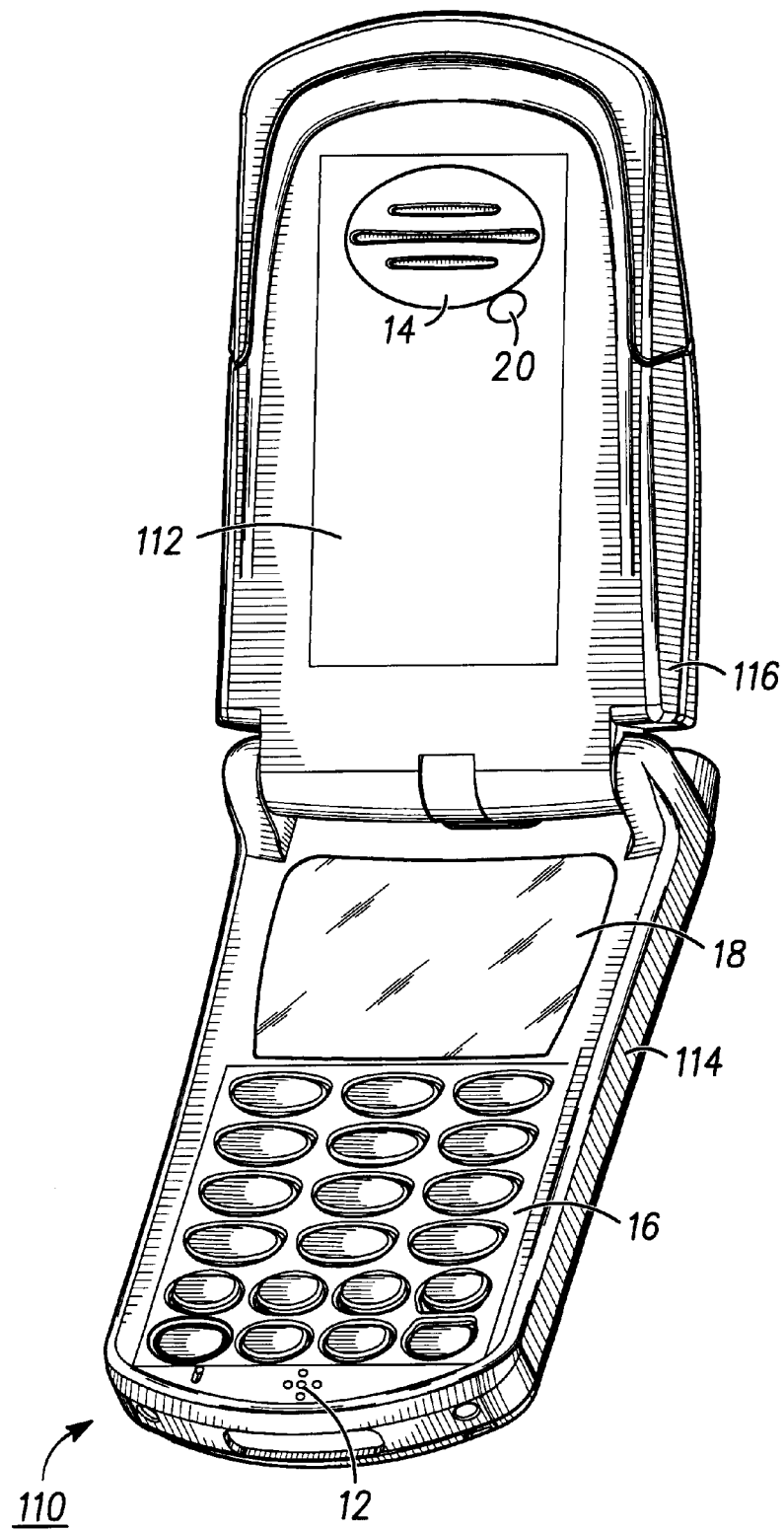
FIG. 10 illustrates an alternative embodiment of the communication device of FIG. 3, in accordance with the preferred embodiment of the present invention.

FIG. 10 illustrates an alternative embodiment of a communication device in accordance with the preferred embodiment of the present invention. The communication device 110, for example, can be a flip style cellular telephone (as illustrated), a cordless telephone, a wired landline telephone, or a personal communicator such as the V200 Personal Communicator manufactured by Motorola Inc. of Schaumburg, Ill. In the following description, the term "communication device" refers to any of the communication devices mentioned above or an equivalent. The communication device 110 preferably is designed to include a first assembly portion 114 and a second assembly portion 116. Preferably the first assembly portion 114 includes the display 18, the microphone 12, and the keypad 16. The second assembly portion 116 preferably includes a clear lens 112, the earpiece 14, and the sensor 20. As illustrated, the earpiece 14 and the sensor 20 are proximately located within the clear lens 112. Preferably, the earpiece 14 can include the speaker 55 (not shown) having an aesthetically pleasing design such as including a decorative metal cap over the speaker 55. When the communication device 110 is closed (i.e.: the second assembly portion 116 is closed on top of the first assembly portion 114, the clear lens 112 is preferably situated over the display 18 such that the device user can view the display 18 through the second assembly portion 116.

Figure 11:
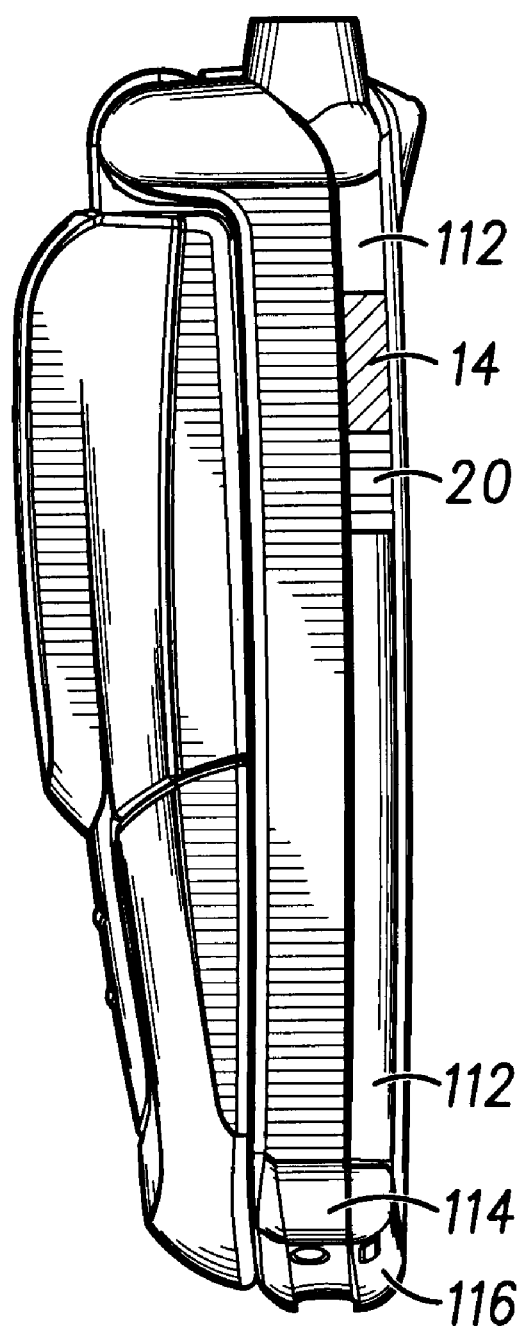
FIG. 11 illustrates a side view of the communication device illustrated in FIG. 10, in accordance with the preferred embodiment of the present invention.

FIG. 11 illustrates a side view of the communication device illustrated in FIG. 10, in accordance with the preferred embodiment of the present invention. As illustrated, the thickness of the second assembly portion 116 can be minimized to the thickness of the clear lens 112 in accordance with the present invention. Conventional communication devices that utilize passive equalization cannot acoustically perform with just the speaker alone. The present invention as described herein and incorporating the active equalization circuit 22 of FIG. 4 allows the use of the speaker element alone without the need for additional mechanical components such as volumes, ports, and damping felts.

Figure 12:
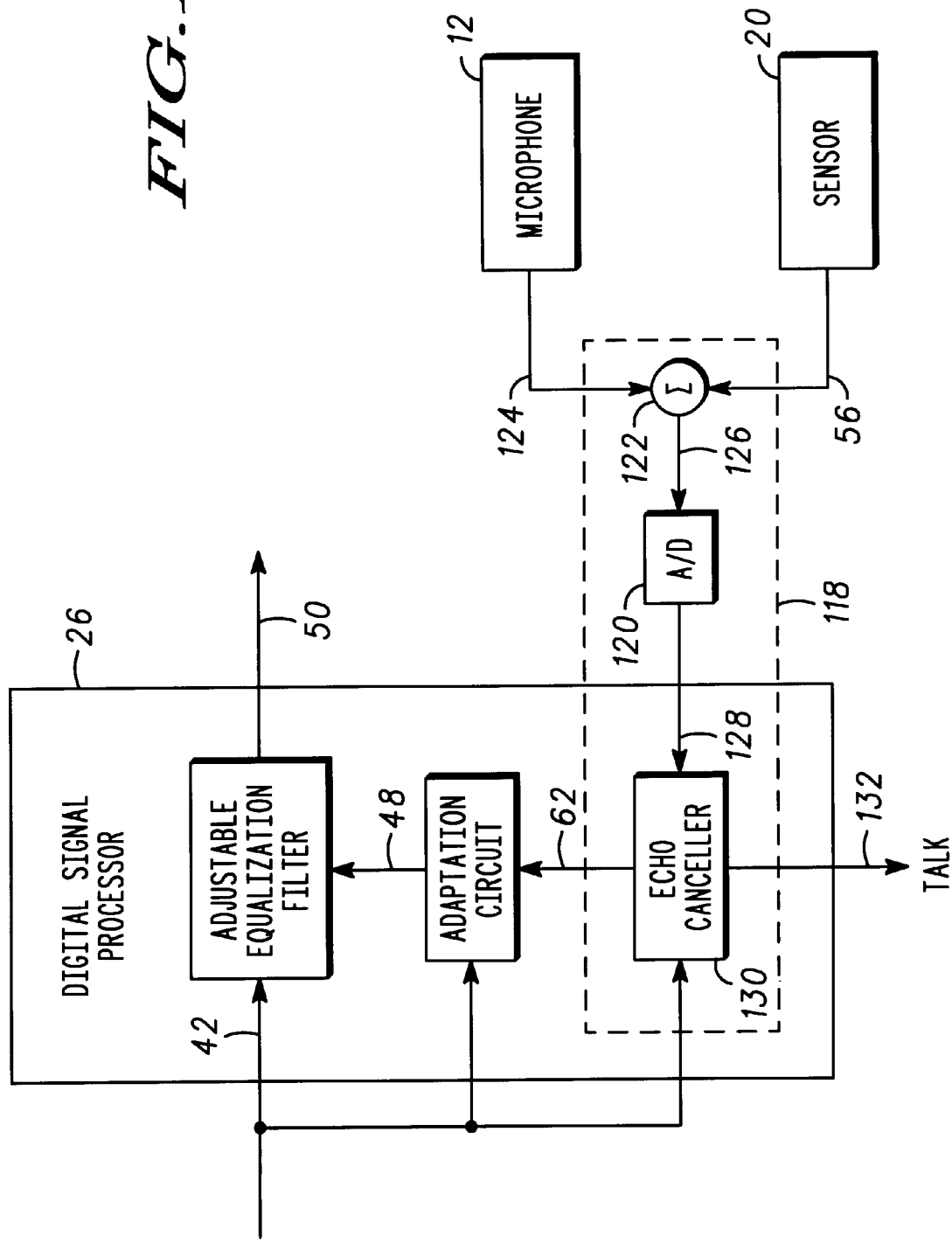
FIG. 12 is an electronic block diagram of a summation block for use with the active equalization circuit of FIG. 4, in accordance with the preferred embodiment of the present invention.

FIG. 12 illustrates a portion of the active equalization circuit 22 of FIG. 4 augmented with a summation block 118 in accordance with the present invention. The summation block 118 allows the use of a shared A/D converter 120 to replace the response A/D converter 60 of FIG. 4. Utilization of the shared A/D converter 120 is especially beneficial to the implementation of the present invention by modifying existing circuitry of a communication device having circuitry for only one additional A/D converter. (i.e. for the A/D converter 38 of FIG. 4) In traditional communication devices, audio signals received by a talk microphone, for example the microphone 12 of FIGS. 3 and 10, are processed through an A/D converter. The present invention, as illustrated in FIG. 12 shares this existing A/D converter between the microphone 12 and the sensor 20. The response signal 56 from the sensor 20 and a talk signal 124 from the microphone 12 are added together by a summer 122 coupled to both the sensor 20 and the microphone 12. The result, a summation signal 126 includes elements of both the response signal 56 and the talk signal 124. The summation signal 126 is then converted from analog to digital using the shared A/D converter 120, coupled to the output of the summer 122, generating a digital summation signal 128. Next, an echo canceller 130 coupled to and receiving the digital input signal 42, and coupled to the shared A/D converter 120, receives and separates the digital summation signal 128. It will be appreciated by one of ordinary skill in the art that the echo canceller 130 can alternatively be programmed into software of another element of the communication device or can be implemented in hardware. The output of the echo canceller 130 includes a talk signal output 132 and the response data signal 62. Processing of the response data signal 62 then continues as illustrated and described in FIG. 4.

The present invention, as described herein in terms of preferred embodiments, is a low cost, minimal sized means for providing a constant frequency response and volume level to a person using a communication device independent of the unique characteristics of the user's ear and how well the communication device is acoustically coupled to the user's ear.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. A communication device comprising:
   an earpiece for transmitting an acoustic output signal from the communication device;
   a sensor, wherein the sensor is proximately located with the earpiece, for measuring an acoustic pressure at the earpiece and generating a response signal; and
   an active equalization circuit coupled to the sensor and receiving the response signal for equalizing the acoustic output signal at the earpiece, wherein the active equalization circuit comprises:
      an audio processing block for receiving and processing a plurality of audio signals, thereby generating a digital input signal;
      a digital signal processor coupled to the audio processing block for receiving and filtering the digital input signal, wherein the digital signal processor comprises:

an adjustable equalization filter, for filtering the digital input signal using a filter response, thereby generating a filtered audio signal, wherein the filter response is adjusted in response to an adjustment signal received from an adaptation circuit, and the adaptation circuit coupled to the adjustable equalization filter and further coupled to the sensor, wherein the adaptation circuit uses the digital input signal and the response signal to generate the adjustment signal; and an output audio processing block coupled to the digital signal processor for receiving and processing the filtered audio signal and sending the processed filtered audio signal to the earpiece.

2. A communication device as recited in claim 1 wherein the audio processing block comprises:

an audio input for receiving the plurality of audio signals, and an amplifier coupled to the audio input for amplifying the plurality of audio signals, thereby generating a plurality of amplified audio signals, wherein the digital input signal is the plurality of amplified audio signals when the plurality of audio signals comprises a plurality of digital audio signals.

3. A communication device as recited in claim 2 wherein the audio processing block further comprises:

an analog to digital converter coupled to the amplifier for converting the plurality of amplified audio signals to the digital input signal.

4. A communication device as recited in claim 1 wherein the adaptation circuit includes noise compensation intelligence.

5. A communication device as recited in claim 1 wherein the output audio processing block includes:

a digital to analog converter for converting the filtered signal to an analog signal, and an output amplifier coupled to the digital to analog converter for amplifying the analog signal received from the digital to analog converter.

6. A communication device as recited in claim 1 wherein the earpiece comprises a speaker coupled to the output audio processing block.

7. A communication device as recited in claim 1 further comprising:

a response signal-processing block coupled to the sensor for processing the response signal from the sensor, thereby generating a response data signal, wherein the adaptation circuit uses the digital input signal and the response data signal to generate the adjustment signal.

8. A communication device as recited in claim 7 wherein the response signal-processing block comprises:

a response amplifier for amplifying the response signal, and a response analog to digital converter coupled to the response amplifier for converting the amplified response signal to the response data signal.

9. A communication device as recited in claim 1 further comprising:

a microphone for generating a talk signal; and a summation block, wherein the summation block comprises:

a summer coupled to the microphone and coupled to the sensor, for adding the talk signal and the response signal, thereby generating a summation signal, a shared analog to digital converter coupled to the summer for converting the summation signal to a digital summation signal, and an echo canceller coupled to the shared analog to digital converter and further coupled to the audio processing block for separating the digital summation signal and generating a talk signal output and the response signal.

10. Within a communication device, a method of active equalization comprising:

fast fourier transforming a response data signal received from a sensor proximately located with an earpiece, thereby generating a transformed response data signal;

fast fourier transforming a digital input signal received from an audio processing block, thereby generating a transformed digital input signal;

dividing the transformed response data signal and the transformed digital input signal, thereby generating a divided signal;

estimating a transfer function using the divided signal;

averaging the transfer function thereby generating a frequency response;

smoothing the frequency response in a frequency domain using a moving average window;

inverting the smoothed frequency response;

inverse fast fourier transforming the inverted transfer function to generate a real valued impulse response;

equalizing the earpiece using a finite impulse response digital filter.

11. A method of active equalization as recited in claim 10 wherein in the equalizing step, the finite impulse response digital filter uses a weighted average of a plurality of response data signals.

12. A method of active equalization as recited in claim 10 further comprising:

prior to the inverse fast fourier transforming step, frequency shaping the inverted transfer function to attenuate a plurality of low frequencies and boost a plurality of high frequencies.

* * * * *